US008279235B2

(12) United States Patent
Li et al.

(10) Patent No.: US 8,279,235 B2
(45) Date of Patent: Oct. 2, 2012

(54) COLOR CORRECTION METHOD AND COLOR CORRECTING INTEGRATED CHIP

(75) Inventors: Jyun-Sian Li, Tainan (TW); Chih-Chang Lai, Taichung County (TW)

(73) Assignee: Wintek Corporation, Taichung (TW)

( * ) Notice: Subject to any disclaimer, the term of this patent is extended or adjusted under 35 U.S.C. 154(b) by 643 days.

(21) Appl. No.: 12/494,505

(22) Filed: Jun. 30, 2009

(65) Prior Publication Data

US 2010/0002010 A1 Jan. 7, 2010

(30) Foreign Application Priority Data

Jul. 3, 2008 (TW) ............................... 97125145 A

(51) Int. Cl.

| | |
|---|---|
| ***G09G 5/00*** | (2006.01) |
| ***G09G 5/02*** | (2006.01) |
| ***H04N 17/00*** | (2006.01) |
| ***H04N 5/202*** | (2006.01) |
| ***H04N 1/46*** | (2006.01) |
| ***G03F 3/08*** | (2006.01) |
| ***G06K 9/40*** | (2006.01) |
| *G09G 5/36* | (2006.01) |
| *H04N 17/02* | (2006.01) |
| *H04N 5/46* | (2006.01) |
| *G06K 9/00* | (2006.01) |
| *G06K 9/36* | (2006.01) |

(52) U.S. Cl. ........ 345/589; 345/591; 345/690; 345/606; 345/549; 348/180; 348/254; 348/557; 348/674; 358/525; 358/504; 358/519; 358/523; 382/167; 382/254; 382/274; 382/276

(58) Field of Classification Search .......... 345/426–428, 345/581, 589–590, 591, 604, 600–602, 606, 345/644, 501, 519, 536, 546–549, 559, 204, 345/690, 77; 348/179–180, 253–254, 441, 348/552, 557, 671, 673–674, 739, 761
See application file for complete search history.

(56) References Cited

U.S. PATENT DOCUMENTS

| | | | | |
|---|---|---|---|---|
| 2003/0053001 | A1 * | 3/2003 | Murashita et al. | 348/649 |
| 2003/0117414 | A1 * | 6/2003 | Sasaki | 345/589 |
| 2006/0146066 | A1 * | 7/2006 | Sasaki | 345/590 |
| 2009/0109233 | A1 * | 4/2009 | Kerofsky et al. | 345/589 |
| 2009/0219244 | A1 * | 9/2009 | Fletcher et al. | 345/102 |

* cited by examiner

*Primary Examiner* — Wesner Sajous
(74) *Attorney, Agent, or Firm* — Thomas|Kayden

(57) ABSTRACT

A color correction method is provided. Grey values of three primary colors of an image data are transformed into initial characteristic values in a color space. Three sets of characteristic values of a to-be-corrected apparatus when the apparatus displays the primary colors respectively are measured. The characteristic values of the image data are transformed into a set of adjusted brightness values of the primary colors according to the characteristic values and a color space transformation equation. Gamma curves of the apparatus when displaying the primary colors are measured and modified to generate new grey-value vs. brightness relationships for the primary colors, so as to obtain adjusted grey values of the primary colors corresponding to the adjusted brightness values.

21 Claims, 9 Drawing Sheets

COLOR CORRECTION METHOD AND COLOR CORRECTING INTEGRATED CHIP

This application claims the benefit of Taiwan application Serial No. 97125145, filed Jul. 3, 2008, the subject matter of which is incorporated herein by reference.

BACKGROUND OF THE INVENTION

1. Field of the Invention

The invention relates in general to a color correction method and a color correcting integrated chip, and more particularly to a color correction method applicable to a display or a color system apparatus and a color correcting integrated chip.

2. Description of the Related Art

Conventionally, when the display device receives an image data, the grey value signal of the image data is directly stored in a random-access memory (RAM) of the display and outputted, and the gamma voltage of the grey value signal is output accordingly. However, whether the color gamut of the received image signal is in accordance with the color gamut of the display device is not taken into account. As a consequence, the displayed image is biased.

For example, if an image is generated according to the color gamut conforming to sRGB standard, then the grey value data of each pixel aims to achieve that the X, Y, Z stimulus values are a point in the range of color gamut conforming to sRGB standard. However, due to the size of the color gamut of the display device or the three apexes of pure R, G, B being different from that of sRGB standard, the X, Y, Z stimulus value received by human eyes will be different if the image data is directly inputted to the display device. Thus, the above problem of biased image occurs.

SUMMARY OF THE INVENTION

The invention is directed to a color correction method and a color correcting integrated chip. The characteristics of an image data are adjusted according to the characteristics of a to-be-corrected apparatus, such that the adjusted image data can truthfully reproduce the original image for the viewers.

According to a first aspect of the present invention, a color correction method is provided. Firstly, grey values of three primary colors of an image data are transformed into initial characteristic values in a color space. Next, three sets of characteristic values of a to-be-corrected apparatus when the apparatus displays the three primary colors respectively are measured. Then, the set of the characteristic values of the image data is transformed into adjusted brightness values of the primary colors according to the three sets of the characteristic values of the to-be-corrected apparatus and a color space transformation equation. Lastly, the gamma curves of the to-be-corrected apparatus when the apparatus displays the three primary colors respectively are measured and modified to generate new grey-value vs. brightness relationships for the three primary colors, so as to obtain adjusted grey values of the three primary colors corresponding to the adjusted brightness values.

According to a second aspect of the present invention, a color correcting integrated chip including a storage unit, a register and a color correction unit is provided. The storage unit stores many items of transformation characteristic data of different image formats. The register is used for temporarily storing three sets of the characteristic values of a to-be-corrected apparatus measured when the apparatus displays the three primary colors respectively and for temporarily storing gamma curves of the to-be-corrected apparatus measured when the apparatus displays the three primary colors respectively. The color correction unit is used for receiving an image data and accessing the transformation characteristic data of the image data from the storage unit according to the image format of the image data, so as to transform the grey values of the three primary colors of the image data into a set of initial characteristic value in a color space. The color correction unit further transforms the set of the characteristic values of the image data into a set of adjusted brightness values of the primary colors according to the three sets of the characteristic values of the to-be-corrected apparatus measured when the apparatus displays the three primary colors respectively and a color space transformation equation. The color correction unit further modifies the measured gamma curves of the to-be-corrected apparatus to generate new grey-value vs. brightness relationships for the three primary colors, so as to obtain adjusted grey values of the three primary colors corresponding to the adjusted brightness values.

The invention will become apparent from the following detailed description of the preferred but non-limiting embodiments. The following description is made with reference to the accompanying drawings.

DETAILED DESCRIPTION OF THE INVENTION

First Embodiment

Figure 1A:
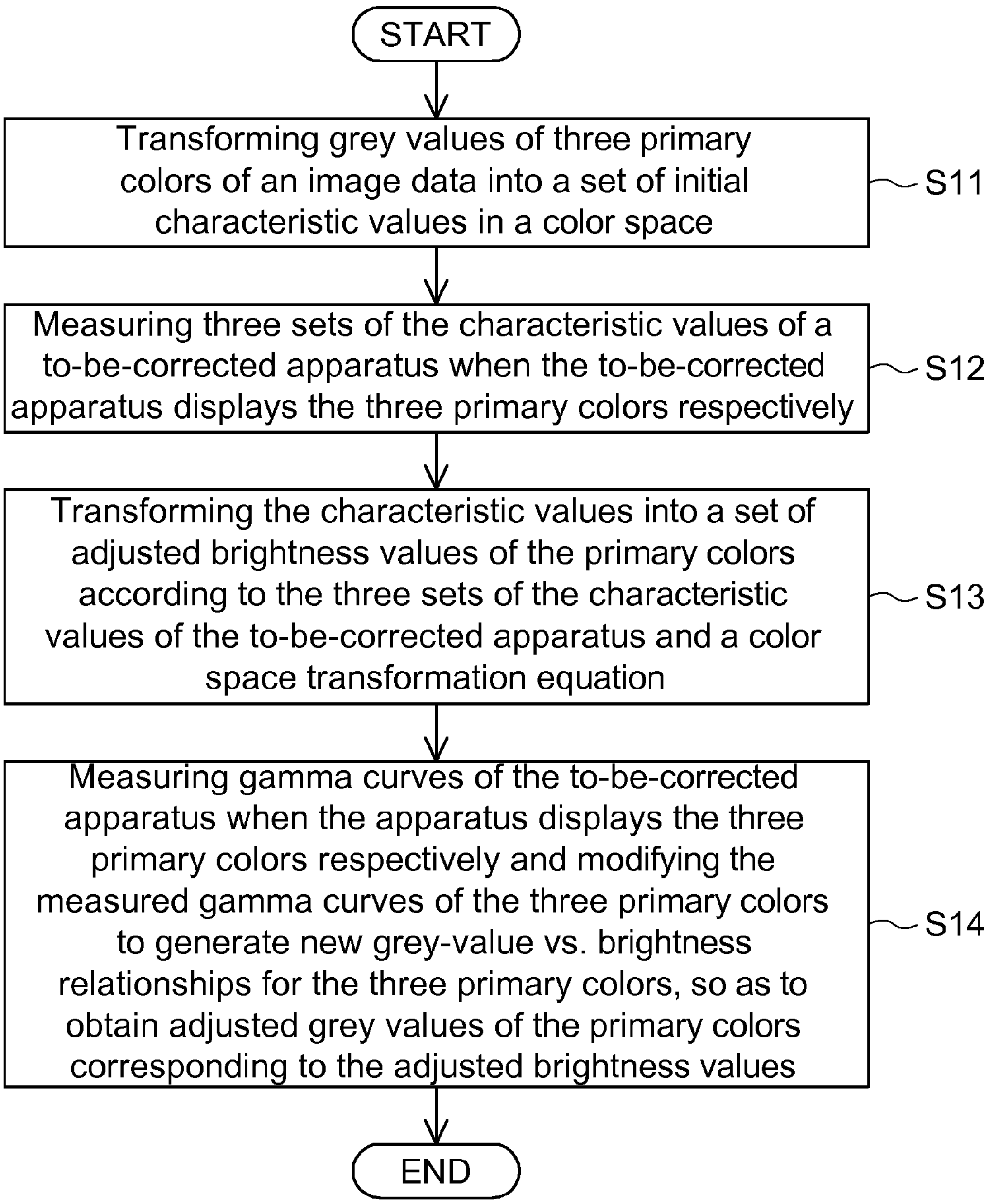
FIG. 1A shows a flowchart of a color correction method according to a first embodiment of the invention.

Referring to FIG. 1A, a flowchart of a color correction method according to a first embodiment of the invention is shown. The color correction method includes steps S11~S14. Firstly, the method begins at step S11, the grey values of the three primary colors (red, the green and the blue) of an image data is transformed into a set of initial characteristic values in a color space. Then, the method proceeds to step S12, three sets of the characteristic values of a to-be-corrected apparatus are measured when the apparatus displays the three primary colors respectively. Next, the method proceeds to step S13, the set of the characteristic values is transformed into a set of adjusted brightness values of the primary colors according to the three sets of the characteristic values of the to-be-corrected apparatus and a color space transformation equation.

Then, the method proceeds to step S14, the gamma curves of the to-be-corrected apparatus when displaying the three primary colors respectively are measured and modified to generate new grey-value vs. brightness relationships for the three primary colors, so as to obtain adjusted grey values of the three primary colors corresponding to the adjusted brightness values.

Figure 2A:
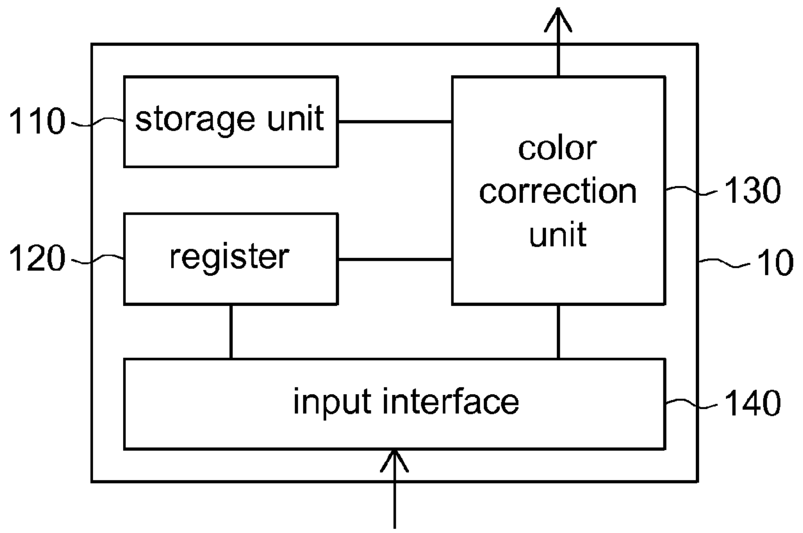
FIG. 2A shows a circuit block diagram of a color correcting integrated chip of the first embodiment.

Examples of the to-be-corrected apparatus include a display device, and the present embodiment of the invention discloses a color correcting integrated chip. The color correcting integrated chip can be an independent chip. The independent chip is, for example, an application-specific integrated circuit (ASIC) that can be disposed in a display chip of the display device for color correction directly. Referring to FIG. 2A, a circuit block diagram of a color correcting integrated chip 10 of the first embodiment is shown. Also referring to FIG. 2B, a circuit block diagram of a display chip 20 of the first embodiment is shown. In FIG. 2A, the integrated chip 10 includes a storage unit 110, a register 120 and a color correction unit 130. The storage unit 110 stores many items of transformation characteristic data of different image formats. The register 120 is used for temporarily storing three sets of the characteristic values of the to-be-corrected apparatus measured via an input interface 140 when the apparatus displays the three primary colors respectively and for temporarily storing the gamma curves of the to-be-corrected apparatus measured when the apparatus displays the three primary colors respectively. The color correction unit 130 is used for receiving an image data by the input interface 140 and accessing the transformation characteristic data of the image data from the storage unit 110 according to the image format of the image data, so as to transform the grey values of the three primary colors of the image data into initial characteristic values in a color space. The color correction unit 130 further transforms the characteristic values of the image data into adjusted brightness values of the primary colors according to the three sets of the characteristic value of the to-be-corrected apparatus measured when the apparatus displays the three primary colors respectively and a color space transformation equation. The color correction unit 130 further modifies the measured the gamma curve of the three primary colors of the to-be-corrected apparatus to generate new grey-value vs. brightness relationships for the three primary colors, so as to obtain adjusted grey values of the three primary colors corresponding to the adjusted brightness values.

Figure 2B:
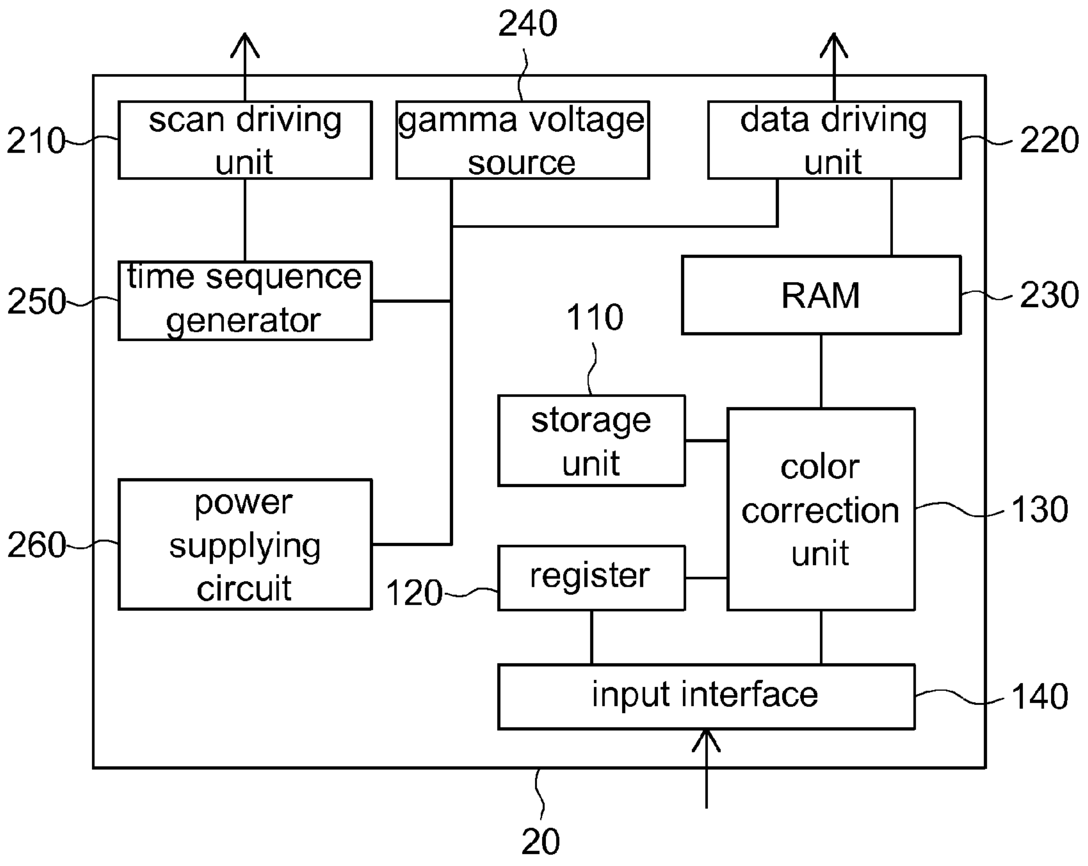
FIG. 2B shows a circuit block diagram of a display chip of the first embodiment.

As indicated in FIG. 2B, the display chip 20 includes the integrated chip 10 that includes the storage unit 110, the register 120 and the color correction unit 130 mentioned above. The display chip 20 further includes a scan driving unit 210, a data driving unit 220, a random-access memory (RAM) 230, a gamma voltage source 240, a time sequence generator 250 and a power supplying circuit 260. The image data after corrected by the color correction unit 130 according to the characteristics of the display device is stored in the RAM 230 of the display chip 20, and the corrected image is then displayed by the use of the elements stated above. The steps of the color correction method of the present embodiment of the invention are elaborated below.

The present embodiment of the invention is exemplified by an image data defined according to sRGB standard. However, the invertion is not limited thereto. The image data can also be defined according to Adobe standard or other color system apparatus. The image data is transformed into a CIE XYZ color space, wherein the initial characteristic values (X, Y, Z) in the CIE XYZ color space are three stimulus values to the viewers, and are also the signals of the grey values (R, G, B) of the three primary colors of the image data displayed on an sRGB standard screen.

In step S11, the grey values (R, G, B) of the three primary colors of the image data are transformed into the initial characteristic values (X, Y, Z) of the CIE XYZ color space, the grey values (R, G, B) of the three primary colors are transformed into original brightness values (dR, dG, dB) of the three primary colors first and then the original brightness values (dR, dG, dB) of the three primary colors are transformed into the initial characteristic values (X, Y, Z). The grey values (R, G, B) of the three primary colors are transformed into the original brightness values (dR, dG, dB) of the three primary colors by the color correction unit 130 according to the equation stated below:

$$\text{if } \frac{R}{\text{Max\_grey}} \le 0.03928, \text{ then } dR = \frac{R/\text{Max\_grey}}{12.92}, \text{ otherwise } dR = \left(\frac{R/\text{Max\_grey} + 0.055}{1.055}\right)^{2.4}; \quad (1)$$

$$\text{if } \frac{G}{\text{Max\_grey}} \le 0.03928, \text{ then } dG = \frac{G/\text{Max\_grey}}{12.92}, \text{ otherwise } dG = \left(\frac{G/\text{Max\_grey} + 0.055}{1.055}\right)^{2.4}; \text{ and} \quad (2)$$

$$\text{if } \frac{B}{\text{Max\_grey}} \le 0.03928, \text{ then } dB = \frac{B/\text{Max\_grey}}{12.92}, \text{ otherwise } dB = \left(\frac{B/\text{Max\_grey} + 0.055}{1.055}\right)^{2.4} \quad (3)$$

In equations (1)~(3), Max_grey is a maximum grey value that the to-be-corrected apparatus displays. Take an 8-bit apparatus for example. The maximum grey value of the 8-bit apparatus is 255. In FIG. 2A, if the inputted image format conforms with an image format defined according to sRGB standard, the color correction unit 130 can obtain the value for the parameters of the above equations such as 1.055, 0.055, 0.03928, 2.4, and 12.92 from the storage unit 110, so as to calculate the original brightness values (dR, dG, dB) of the three primary colors.

With the information of the CIE xy coordinates of the three primary colors (xr,yr,xg,yg,xb,yb)and the defined white characteristic values (Xw,Yw,Zw), the sum of each RGB channel ($S_R$, $S_G$, $S_B$) defined as equation (4) where zr=1−xr−yr, the same as zg and zb that will be obtained.

$$\begin{bmatrix} S_R \\ S_G \\ S_B \end{bmatrix} = \begin{bmatrix} xr & xg & xb \\ yr & yg & yb \\ zr & zg & zb \end{bmatrix}^{-1} \begin{bmatrix} Xw \\ Yw \\ Zw \end{bmatrix} \quad (4)$$

Next, the original brightness values (dR, dG, dB) of the three primary colors are transformed into the initial characteristic values (X, Y, Z) of the CIE XYZ color space according to the equation stated below (5):

$$\begin{bmatrix} X \\ Y \\ Z \end{bmatrix} = \begin{bmatrix} xr*S_R & xg*S_G & xb*S_B \\ yr*S_R & yg*S_G & yb*S_B \\ zr*S_R & zg*S_G & zb*S_B \end{bmatrix} \begin{bmatrix} dR \\ dG \\ dB \end{bmatrix} \quad (5)$$

Herein, the three primary color coordinate of sRGB and the defined white characteristic values are taken into the equation (4) to generate the sum of each RGB channel ($S_R$, $S_G$, $S_B$) as below(6):

$$\begin{bmatrix} S_R \\ S_G \\ S_B \end{bmatrix} = \begin{bmatrix} 0.64 & 0.3 & 0.15 \\ 0.33 & 0.6 & 0.06 \\ 0.03 & 0.1 & 0.79 \end{bmatrix}^{-1} \begin{bmatrix} 0.9505 \\ 1 \\ 1.0891 \end{bmatrix} = \begin{bmatrix} 0.6444 \\ 1.1919 \\ 1.2032 \end{bmatrix} \quad (6)$$

And the conversion matrix according to sRGB standard between original brightness values (dR, dG, dB) of the three primary colors and the initial characteristic values (X, Y, Z) of the CIE XYZ color space is obtained by the equation (7) stated below:

$$\begin{bmatrix} X \\ Y \\ Z \end{bmatrix} = \begin{bmatrix} 0.64*0.6444 & 0.3*1.1919 & 0.15*1.2032 \\ 0.33*0.6444 & 0.6*1.1919 & 0.06*1.2032 \\ 0.03*0.6444 & 0.1*1.1919 & 0.79*1.2032 \end{bmatrix} \begin{bmatrix} dR \\ dG \\ dB \end{bmatrix} = \begin{bmatrix} 0.4124 & 0.3576 & 0.1805 \\ 0.2126 & 0.7152 & 0.0722 \\ 0.0193 & 0.1192 & 0.9505 \end{bmatrix} \begin{bmatrix} dR \\ dG \\ dB \end{bmatrix} \quad (7)$$

Then, according to the above equation (7), the values (dR, dG, dB) are transformed into the characteristics values (X, Y, Z). Next, the method proceeds to step S12, three sets of the characteristic values, namely (Xr, Yr, Zr), (Xg, Yg, Zg), (Xb, Yb, Zb), of the to-be-corrected apparatus when the apparatus displays the three primary colors respectively are measured, wherein (Xr, Yr, Zr) are the characteristic values measured by a colorimeter when the to-be-corrected apparatus displays pure red, (Xg, Yg, Zg) are the characteristic values measured when the to-be-corrected apparatus displays pure green, and (Xb, Yb, Zb) are the characteristic values measured when the to-be-corrected apparatus displays pure blue. After the three sets of the characteristic values are measured, the characteristic values are transmitted to the register 120 via the input interface 140 (shown in FIG. 2A) and are temporarily stored in the register 120. Preferably, the register 120 has 9 sub-registers for storing the values of Xr, Xg, Xb, Yr, Yg, Yb, Zr, Zg and Zb respectively. The relationship for transforming the characteristic values (X, Y, Z) into the adjusted brightness values (dR', dG', dB') of the primary colors can be obtained according to the additivity of the light.

Herein, the process transferring from grey values (R, G, B) to the original brightness values (dR, dG, dB) is simply an example for sRGB, and those of ordinary skill in the art will recognize that the transferring of the process could be somewhat depending on the standard or the apparatus characteristics and may not be limited to the method described here.

In step S11, when a corrected apparatus characteristics are applied, each gamma curve of the three primary colors of the corrected apparatus are measured respectively and characterized to generate grey-value vs. brightness relationships. And the process of the characterization could use the Boltzmann function to implement. Take red color for example. The red gamma curve of 17 measuring points is obtained by measuring 17 grey-value red patterns. Therefore, the relationship between grey-value vs. brightness is obtained and the Boltzmann function for modifying the gamma curve is used to characterize the said relationship and expressed as below:

$$dR = \frac{A_{1,r} - A_{2,r}}{1 + e^{(R - x_{0,r})/x_{1,r}}} + A_{2,r} \quad (8)$$

$$dG = \frac{A_{1,g} - A_{2,g}}{1 + e^{(G - x_{0,g})/x_{1,g}}} + A_{2,g} \quad (9)$$

$$dB = \frac{A_{1,b} - A_{2,b}}{1 + e^{(B - x_{0,b})/x_{1,b}}} + A_{2,b} \quad (10)$$

The coefficients $A_1$, $A_2$, $x_0$ and $x_1$ in equations (8)~(10) are coefficients obtained when the gamma curves are modified according to the Boltzmann function, so as to generate new grey-value vs. brightness relationships. The green and the blue gamma curves can also be characterized in the same way. Thus, after the signal of a grey value R is inputted, a corrected signal value R' can be obtained from the grey value R' vs. brightness value dR' relationship. Similarly, the corrected signal values G' and B' for grey values G and B can be obtained in the same way. The grey values (R, G, B) of the three primary colors of the corrected apparatus are transformed into the original brightness values (dR, dG, dB) of the three primary colors and those of ordinary skill in the art will recognize that the transferring of the process could be implemented by other methods and may not be limited to the method described here.

Although the to-be-corrected apparatus is a display device in the present embodiment of the invention for illustration, the to-be-corrected apparatus is also applicable to color correction of a projector. For example, the characteristic values of the red, the green and the blue colors projected onto a screen by the projector are respectively measured first, then the colors are adjusted according to the characteristics of the projector such that the image projected by the projector is corrected and the colors of the image are enhanced.

Then, the method proceeds to step S13, as the three sets of the characteristic values (Xr, Yr, Zr), (Xg, Yg, Zg), (Xb, Yb, Zb) of the to-be-corrected apparatus are already known, the color correction unit 130 transforms the set of the adjusted characteristic values (X, Y, Z) into a set of adjusted brightness values (dR', dG', dB') of the primary colors according to a color space transformation equation. The color space transformation equation is expressed as:

$$\begin{bmatrix} dR' \\ dG' \\ dB' \end{bmatrix} = \begin{bmatrix} Xr & Xg & Xb \\ Yr & Yg & Yb \\ Zr & Zg & Zb \end{bmatrix}^{-1} \begin{bmatrix} X \\ Y \\ Z \end{bmatrix} \quad (11)$$

The adjusted brightness values (dR', dG', dB') of the primary colors can be obtained through the matrix operation of equation (11). Then, the set of the adjusted brightness values (dR', dG', dB') of the primary colors is transformed into a set of adjusted brightness values (R', G', B') of the primary colors, which is executed in step S14.

Figure 5:
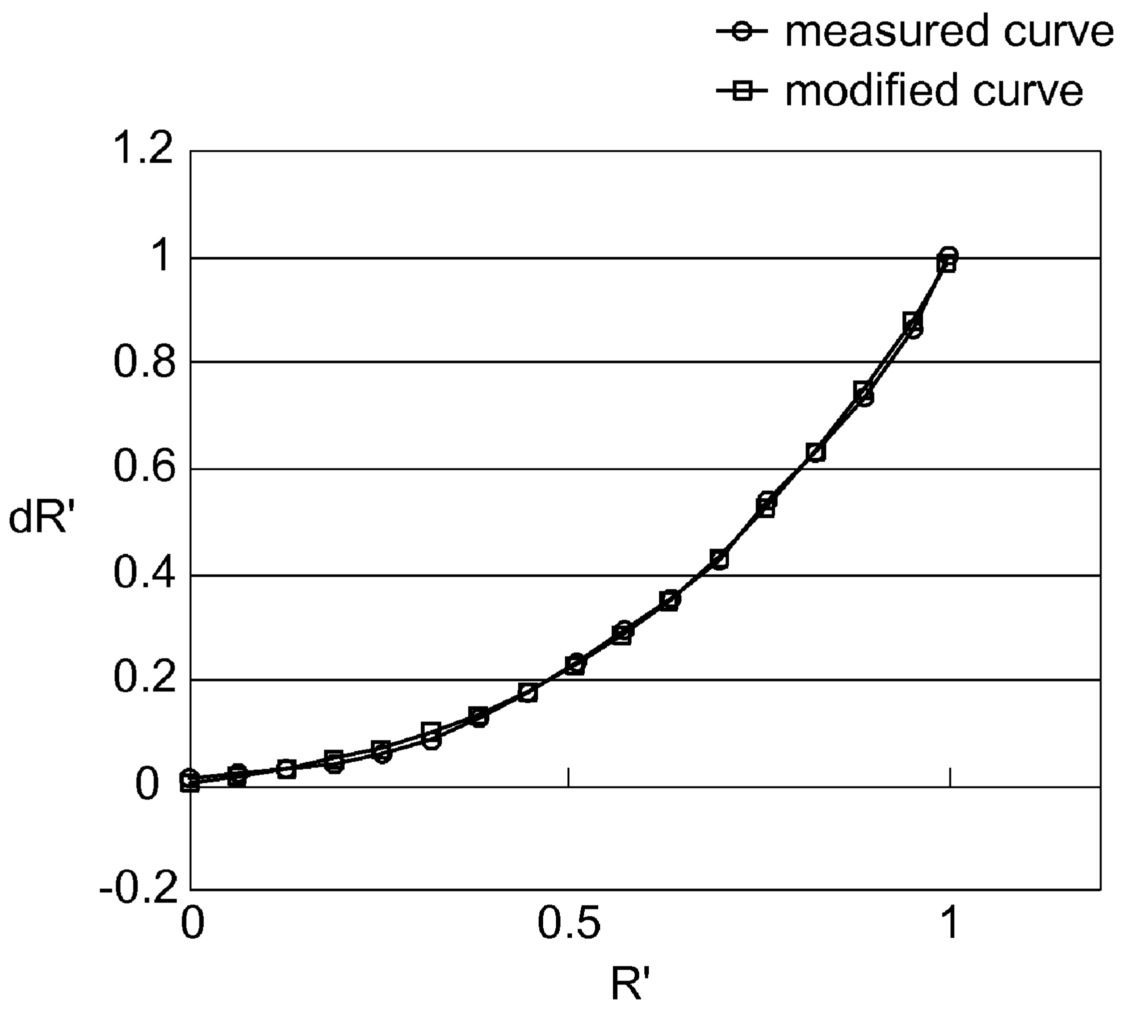
FIG. 5 shows a grey-value vs. brightness relationship of a to-be-corrected apparatus measured and modified when displaying red.

In step S14, the gamma curves of the to-be-corrected apparatus when the apparatus displays the three primary colors respectively are measured and modified to generate new grey-value vs. brightness relationships for the three primary colors, such that adjusted grey values of the three primary colors corresponding to the adjusted brightness values are obtained accordingly. Take red color for example. Referring to FIG. 5, the grey value vs. brightness relationship of the to-be-corrected apparatus measured and modified when displaying red is shown, wherein the horizontal axis R' denotes the grey value ranging from 0 to 1, and the vertical axis dR' denotes the brightness value. In FIG. 5, for example, 17 measuring points are taken, and the red gamma curve of the 17 measuring points is then modified according to a Boltzmann function so as to generate new grey-value vs. brightness relationships. The green and the blue gamma curves can also be modified in the same way. The Boltzmann function for modifying the gamma curve is expressed below:

$$dR' = \frac{A_{1,r} - A_{2,r}}{1 + e^{(R' - x_{0,r})/x_{1,r}}} + A_{2,r} \tag{12}$$

$$dG' = \frac{A_{1,g} - A_{2,g}}{1 + e^{(G' - x_{0,g})/x_{1,g}}} + A_{2,g} \tag{13}$$

$$dB' = \frac{A_{1,b} - A_{2,b}}{1 + e^{(B' - x_{0,b})/x_{1,b}}} + A_{2,b} \tag{14}$$

The coefficients $A_1$, $A_2$, $x_0$ and $x_1$ in equations (12)~(14) are coefficients obtained when the gamma curves are modified according to the Boltzmann function. Thus, after the signal of a grey value R is inputted, a corrected signal value R' can be obtained from the grey value R' vs. brightness value dR' relationship. Similarly, the corrected signal value G' and B' for grey values G and B can be obtained in the same way.

The functions for modifying the gamma curves can also be expressed as below:

$$dR' = \left(\frac{R'}{\text{max\_gray}}\right)^{gamma} \tag{15}$$

$$dG' = \left(\frac{G'}{\text{max\_gray}}\right)^{gamma} \tag{16}$$

$$dB' = \left(\frac{B'}{\text{max\_gray}}\right)^{gamma} \tag{17}$$

Wherein the gamma value in the above equations (15) to (17) ranges from 1.8 to 2.4, gamma value=2.2 is taken for example. Since the gamma values for the three colors R, G, B have been adjusted to 2.2, the adjusted value R' of an input value R can be obtained according to the equations (15) to (17) and the relationship between R and R'. Similarly, the corrected signal value G' and B' for grey values G and B can be obtained in the same way.

Conventionally, when a display chip receives the grey values (R, G, B) signal of the image data, the signal which corresponds to a corresponding voltage according to a gamma voltage source is directly stored in the RAM of the chip and outputted, wherein the voltage is for driving each pixel. However, whether the color gamut of the received (R, G, B) signal is the same with the color gamut of the display is not taken into account. For example, if the signal of (R, G, B) of an image is generated according to the color gamut conforming to sRGB standard, then the grey value data of each R, G, B pixel aim to achieve that the X, Y, Z stimulus values are a point in the range of sRGB standard color gamut. However, due to the size of the color gamut of the display device or the three apexes of pure R, G, B being different from that of sRGB standard, the X, Y, Z stimulus value received by human eyes will be different if the (R, G, B) signal is directly inputted to the display device.

According to the color correction method and the color correcting integrated chip 10 disclosed in the present embodiment of the invention, the color correction unit 130, first of all, transforms the grey values (R, G, B) of the received image data into the characteristic values (X, Y, Z), and then the characteristic values (X, Y, Z) are transformed according to the characteristics of the to-be-corrected apparatus (such as a display device or a projector) so as to obtain corrected grey values (R', G', B'). The corrected grey values (R', G', B') are stored in the RAM 230 of the display chip 20 and then are displayed, such that the desired signals of the characteristic values (X, Y, Z) are provided for human eyes, resolving the problem of biased image.

Figure 1B:
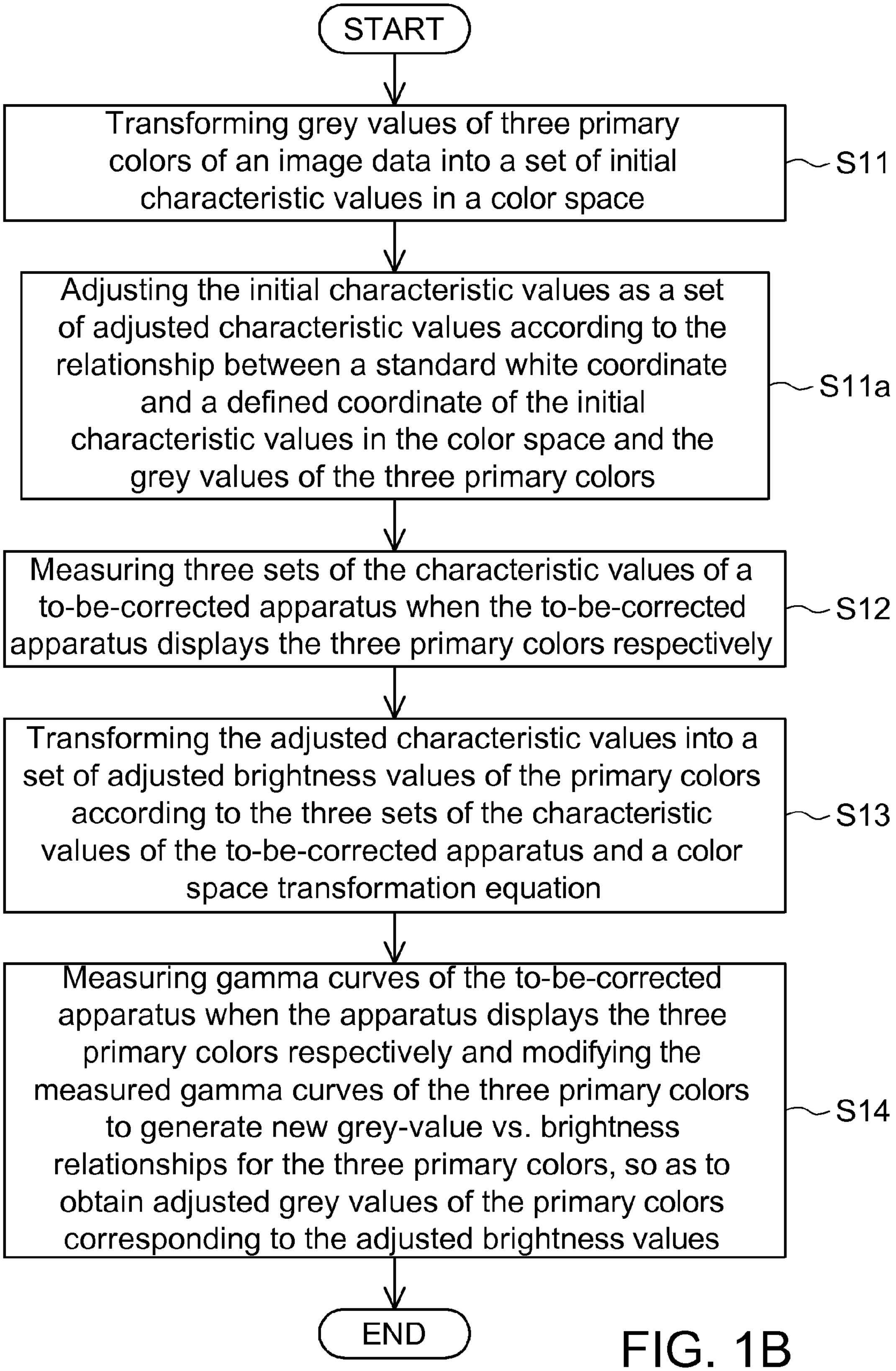
FIG. 1B shows another flowchart of a color correction method according to the first embodiment of the invention.

As shown in FIG. 1B, an additional step S11*a* can be added after step 11, for adjusting the characteristic values (X, Y, Z) to obtain adjusted characteristic values (X', Y', Z'), so as to enhance the color satiation of image.

In step S11*a*, the color correction unit 130 determines a color enhancement direction according to the standard white coordinate and the defined coordinate of the initial characteristic value (X, Y, Z) in the color space first, and then determines a color enhancement coefficient k according to the difference between the maximum value and the minimum value of the grey values (R, G, B) of the three primary colors. The initial characteristic values (X, Y, Z) are transformed into the adjusted characteristic values (X', Y', Z') according to the standard white coordinate, the defined coordinate of the initial characteristic values (X, Y, Z) in the color space, the color enhancement direction and the color enhancement coefficient k. The transformation is elaborated below with accompanying drawings.

Figure 3:
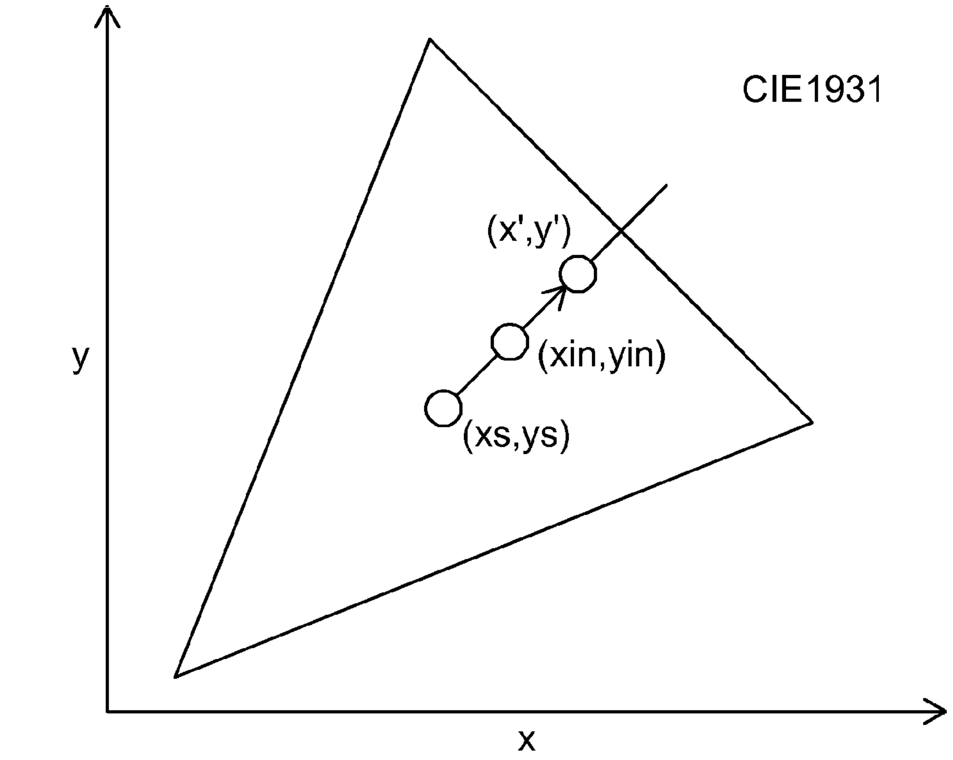
FIG. 3 shows an image data adjusted on a 1931 CIE chromaticity diagram.

Referring to FIG. 3, an image data adjusted on a 1931 CIE chromaticity diagram is shown. In FIG. 3, the standard white coordinate is (xs, ys), the defined coordinate of the characteristic values (X, Y, Z) in CIE XYZ color space is (xin, yin), and the color enhanced coordinate is presumed to be (x', y'). The coordinate (xin, yin) is obtained according to the equations (18) and (19) stated below:

$$xin = \frac{X}{X + Y + Z} \tag{18}$$

$$yin = \frac{Y}{X + Y + Z} \tag{19}$$

For the color to be enhanced towards a correct direction, that is, from (xs, ys) towards (xin, yin), two sets of conditions are added:

$$\text{if } xin \geqq xs\text{, then } x' \geqq xs\text{, otherwise } x' < xs \tag{20}$$

$$\text{if } yin \geqq ys\text{, then } y' \geqq ys\text{, otherwise } y' < ys \tag{21}$$

The linear equation of the straight line passing through coordinates (xs, ys) and (xin, yin) is expressed as:

$$\frac{y' - ys}{x' - xs} = \frac{yin - ys}{xin - xs} \tag{22}$$

Furthermore, assume that the distance between (xs, ys) and (x', y') is k times the distance between (xs, ys) and (xin, yin), wherein k is a color enhancement coefficient:

$$\sqrt{(x'-xs)^2+(y'-ys)^2} = k \times \sqrt{(xin-xs)^2+(yin-ys)^2} \tag{23}$$

Wherein the color enhancement coefficient k is determined according to the difference between the maximum value and the minimum value of the grey values (R, G, B) of the three primary colors and can be regarded as a color purity value of an image pixel. The larger the difference is, the larger the color purity value of the image pixel is, and the larger proportion the image pixel is inclined to a particular color when the image pixel is displayed. Under such circumstances, a smaller degree of color enhancement is applied, that is, a smaller k value is adopted. On the other hand, the smaller the difference is, the smaller the color purity value of the image pixel is, and the smaller proportion the image pixel is inclined to a particular color when the image pixel is displayed. Under such circumstances, a larger degree of color enhancement is applied, that is, a larger k value is adopted. Preferably, the difference (or color purity value) can be classified to one of several levels, wherein each level has a threshold value and each corresponds to a color enhancement coefficient k. Take Table 1 below for example.

TABLE 1

| Threshold Value | Color Enhancement Coefficient k |
|---|---|
| 150 | 1 |
| 144 | 1.025 |
| 138 | 1.05 |
| 132 | 1.075 |
| 126 | 1.1 |
| 120 | 1.125 |
| 114 | 1.15 |
| 108 | 1.175 |
| 102 | 1.2 |
| 96 | 1.225 |
| 90 | 1.25 |
| 84 | 1.275 |
| 78 | 1.3 |
| 72 | 1.325 |
| 66 | 1.35 |
| 60 | 1.375 |
| 54 | 1.4 |
| 48 | 1.425 |
| 42 | 1.45 |
| 36 | 1.475 |
| 30 | 1.5 |
| 24 | 1.525 |
| 18 | 1.55 |
| 12 | 1.575 |
| Other Threshold | 1.6 |

If the grey values of an image pixel are (200, 20, 20), the difference between the maximum grey value and the minimum grey value is 180, which is larger than the threshold value 150. According to Table 1, the corresponding color enhancement coefficient k is 1, which means the image pixel does not need color enhancement processing. If the grey values of another image pixel are (150, 140, 145), the difference between the maximum grey value and the minimum grey value is 10. According to Table 1, the corresponding color enhancement coefficient k is 1.6, so the image pixel has a higher level of color enhancement processing than the previous image pixel. After the color enhancement coefficient k is determined, the value is applied to the equation (23).

Then, equations (20)~(23) form a set of simultaneous equations, and the color enhanced coordinate (x', y') can be obtained from the set of simultaneous equations accordingly. Each item of the adjusted characteristic values (X', Y', Z') is as follows:

$$X' = x' \times (Y/y'),$$

$$Y' = Y,$$

$$Z' = (1 - x' - y') \times (Y/y') \quad (24)$$

Figure 4:
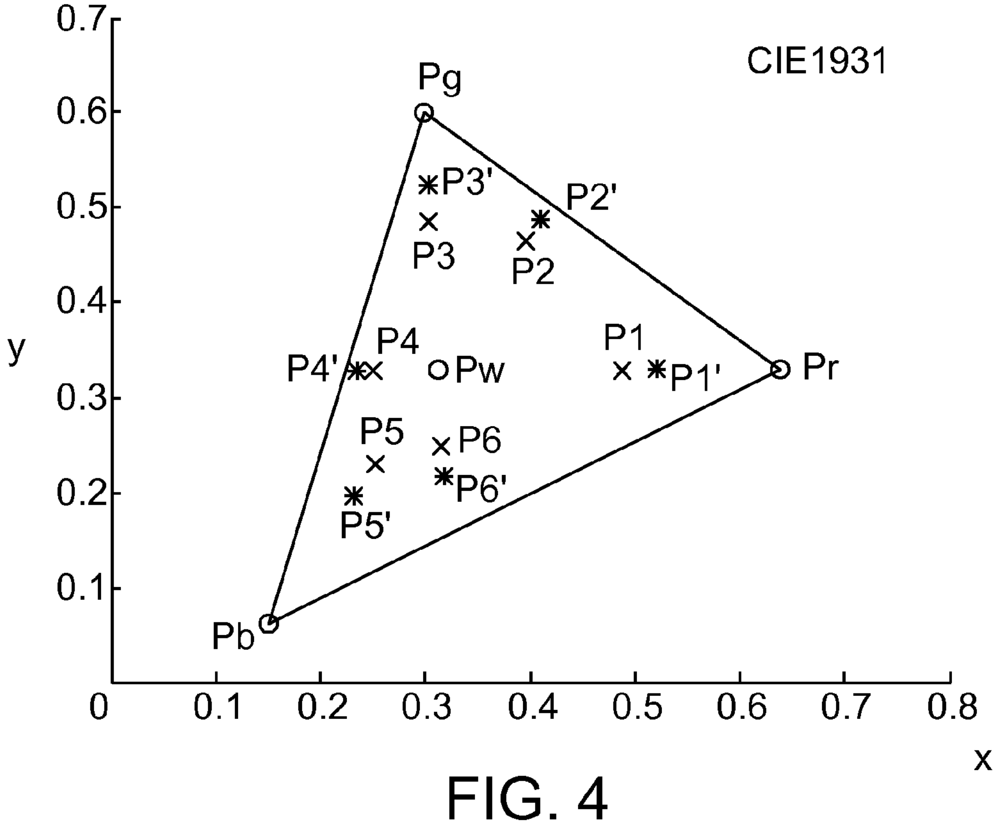
FIG. 4 shows the testing result of 6 testing points treated with color enhancement process.

In order to prove that the color correction method of the present embodiment of the invention indeed enhances color saturation for an image, 6 testing points are inputted as an example. The grey values of the 6 testing points are (192, 80, 80), (192, 192, 80), (96, 192, 96), (96, 192, 192), (128, 128, 192) and (192, 128, 192) respectively, and the testing results are shown in FIG. 4. In FIG. 4, the points Pr, Pg, Pb, Pw respectively are the CIE 1931 coordinates of the red, the green, the blue and the white colors defined according to sRGB standard; P1~P6 are 6 inputted testing points; and P1'~P6' are the coordinates of P1~P6 after the step of color enhancement processing. As indicated in FIG. 4, the coordinates of the 6 testing points all move towards the position with higher color saturation.

After that, the steps S12, S13, and S14 are performed as stated above, not only solving the problem of biased image but also enhancing the color satiation.

The present embodiment of the invention is exemplified by the case that the image data defined according to sRGB standard is transformed into CIE XYZ color space, however the present embodiment of the invention is also applicable to the image data defined according to Adobe RGB standard or other color system apparatus. The image data defined according to Adobe RGB standard or other color system apparatus can be used and transformed into CIE XYZ color space, then the color of the image data is corrected according to the above method of color correction.

Second Embodiment

Figure 6A:
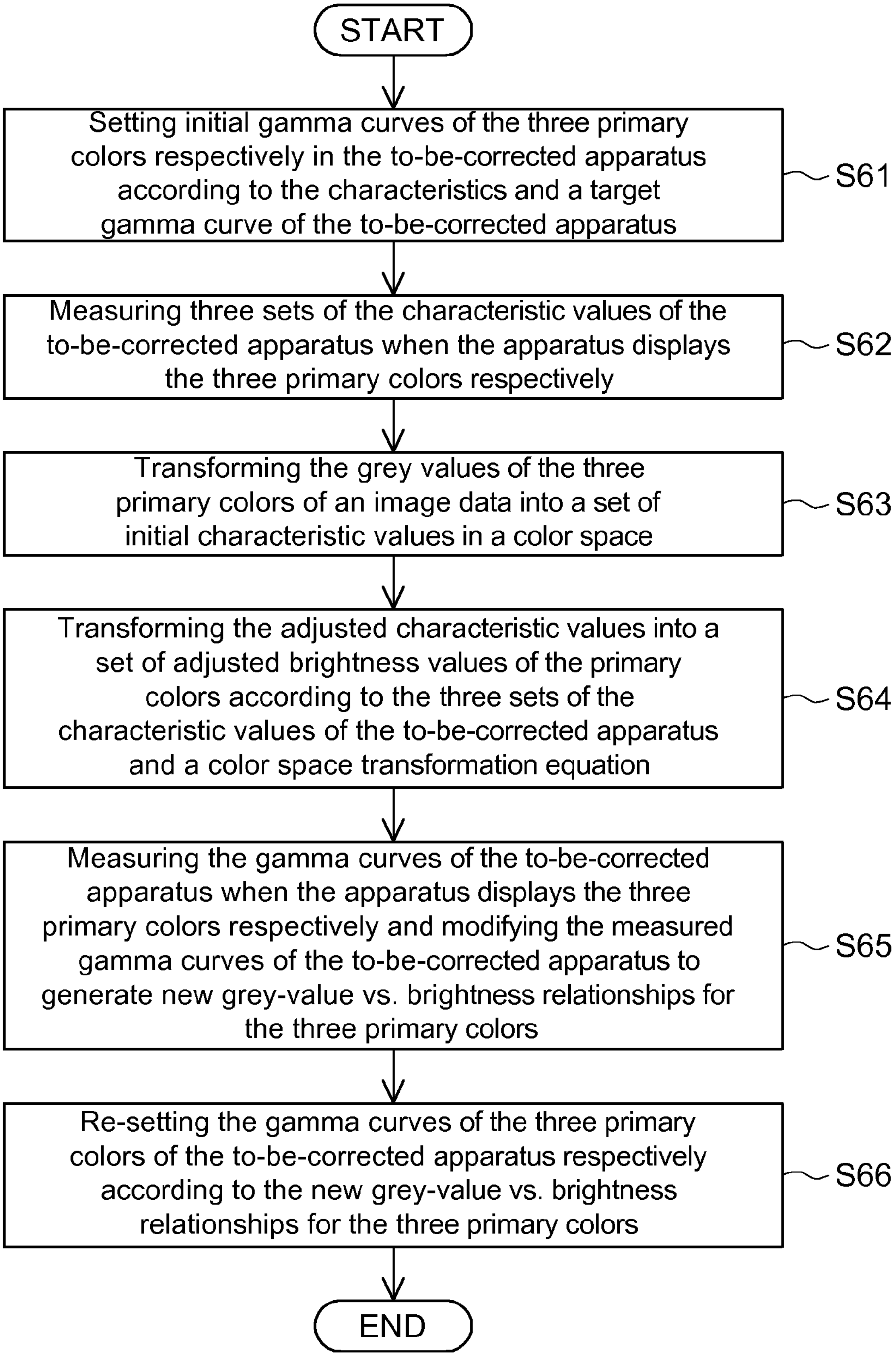
FIG. 6A shows a flowchart of a color correction method according to a second embodiment of the invention
Figure 7A:
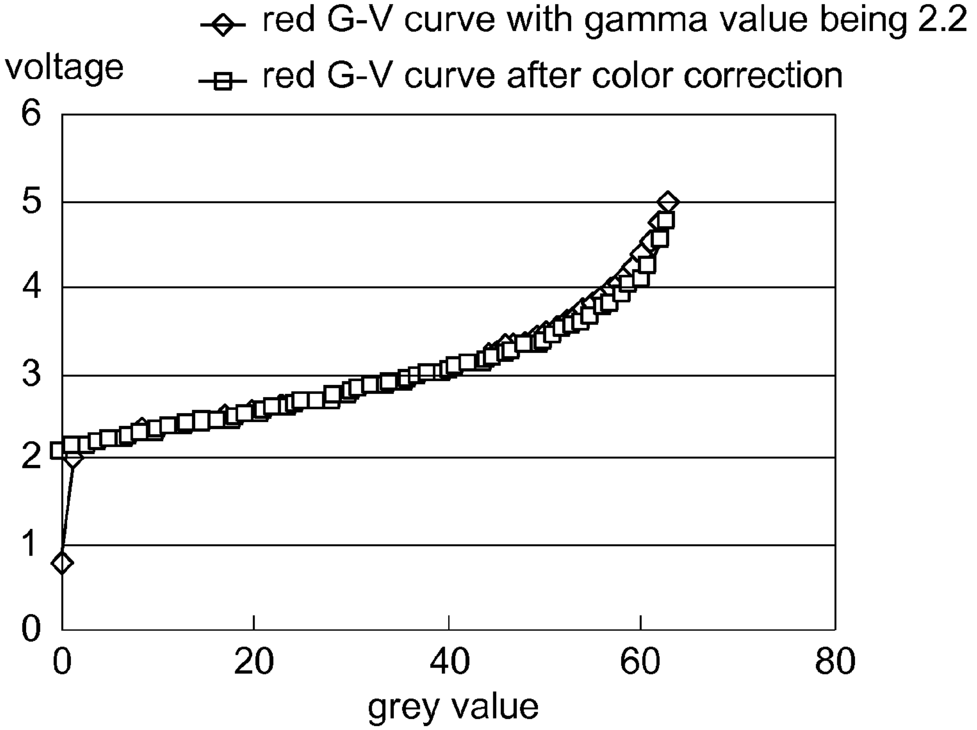
FIGS. 7A~7C respectively show the red, green and blue grey-value vs. voltage curves of the to-be-corrected apparatus before and after correction.
Figure 7B:
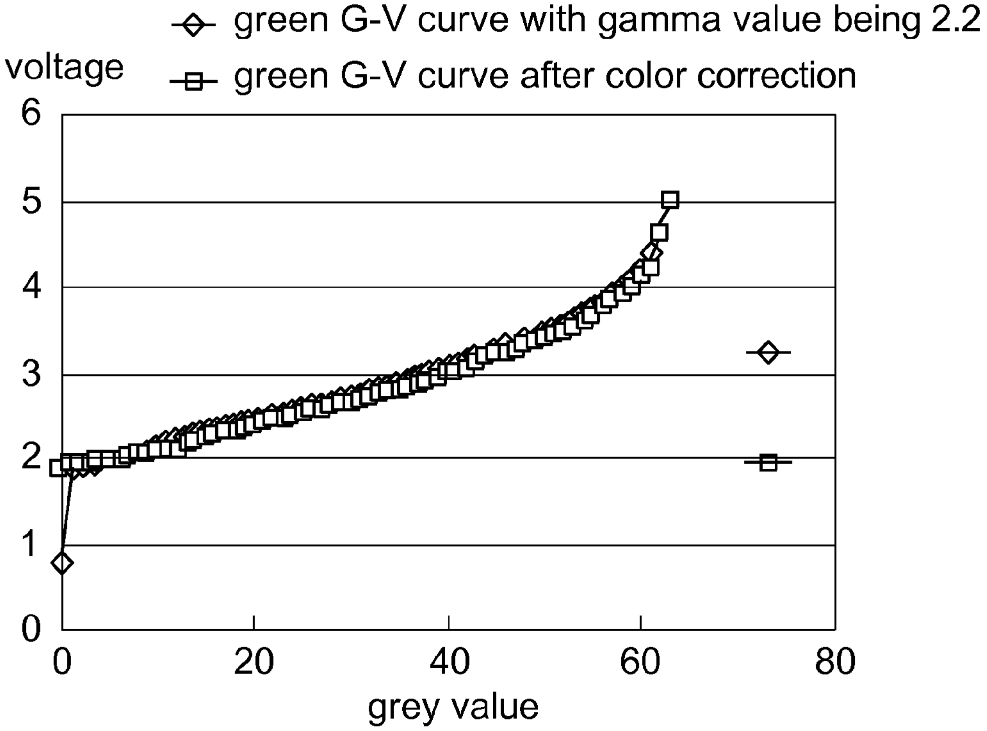
Figure 7C:
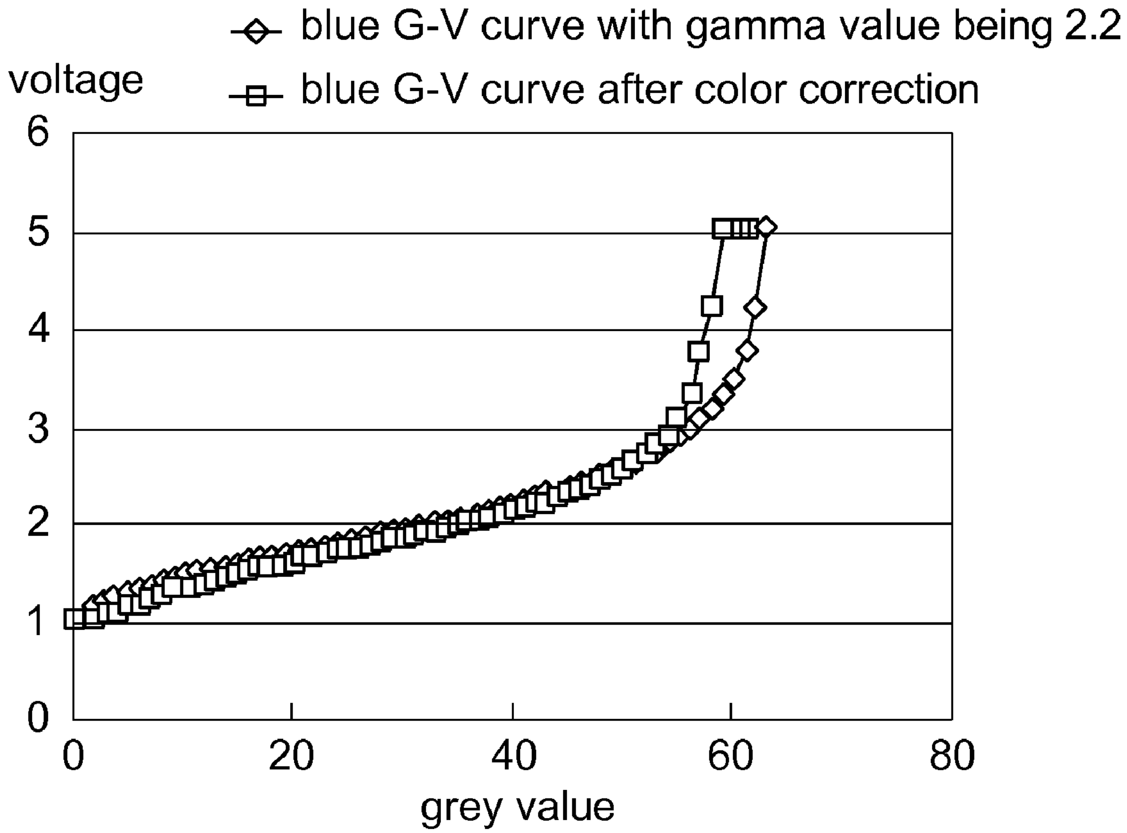

Referring to FIG. 6A, a flowchart of a color correction method according to a second embodiment of the invention is shown. The color correction method of the second embodiment is for setting the gamma curves of a to-be-corrected apparatus such as a display device. The color correction method of the second embodiment of the invention includes steps S61~S66. Firstly, the method begins at step S61, initial gamma curves of the three primary colors are respectively set in the to-be-corrected apparatus according to the characteristics and a target gamma curve of the to-be-corrected apparatus. Referring to FIGS. 7A~7C, the red, the green and the blue grey value vs. voltage (G-V) curves of the to-be-corrected apparatus before and after correction are respectively shown. The red, the green and the blue G-V curves obtained according to the characteristics and pre-determined gamma curve (the target gamma value is normally 2.2) of the to-be-corrected apparatus are the target curves for the red, the green and the blue color respectively. In subsequent steps, the to-be-corrected apparatus displays an image according to the target curves.

Next, the method proceeds to step S62, three sets of the characteristic values of the to-be-corrected apparatus when the apparatus displays the three primary colors respectively are measured. For example, the characteristic value of the to-be-corrected apparatus measured when displaying red color is (Xr, Yr, Zr), the characteristic value of the to-be-corrected apparatus measured when displaying green color is (Xg, Yg, Zg), and the characteristic value of the to-be-corrected apparatus measured when displaying blue is (Xb, Yb, Zb). The present step is similar to step S12 of the first embodiment, and is not repeated here.

Then, the method proceeds to step S63, the grey values (R, G, B) of the three primary colors (red, green and blue) of the image data are transformed into initial characteristic values in a color space, such as the characteristic values (X, Y, Z) in the CIE XYZ color space for example. Steps S63 of the second embodiment is similar to steps S11 of the first embodiment, and is not repeated here.

Then, the method proceeds to step S64, the characteristic values (X, Y, Z) are transformed into adjusted brightness values (dR', dG', dB') of the primary colors according to the three sets of the characteristic values, namely (Xr, Yr, Zr), (Xg, Yg, Zg), (Xb, Yb, Zb), of the to-be-corrected apparatus and a color space transformation equation as indicated in the equation (12) of the first embodiment. Next, the method proceeds to step S65, the gamma curves of the to-be-corrected apparatus when the apparatus displays the three primary colors respectively are measured and modified to generate new grey-value vs. brightness relationships for the three primary colors.

Steps S64 and S65 of the second embodiment being similar to steps S14 and S15 of the first embodiment are not repeated here. After new grey-value vs. brightness relationships for the three primary colors are generated, the respective G-V curves for the red, the green and the blue after color correction are known and are shown in FIGS. 7A~7C. Take FIG. 7C example, the area with higher grey values will be moved to even higher area in the corrected blue G-V curve, such that the color gamut of the to-be-corrected apparatus will be corrected towards blue color and become even closer to the color gamut defined by sRGB standard.

Next, the method proceeds to step S66, the gamma curves of the three primary colors of the to-be-corrected apparatus are respectively re-set according to new grey-value vs. brightness relationships for the three primary colors. After the corrected gamma curves are directly set in the to-be-corrected apparatus, when the grey value signals (Rin, Gin, Bin) of a new image is inputted, the desired values (X, Y, Z) of the grey value signals (Rin, Gin, Bin) to human eyes will be displayed without color correction because the new image is driven by the voltage generated according to new R, G, B gamma curves.

Figure 6B:
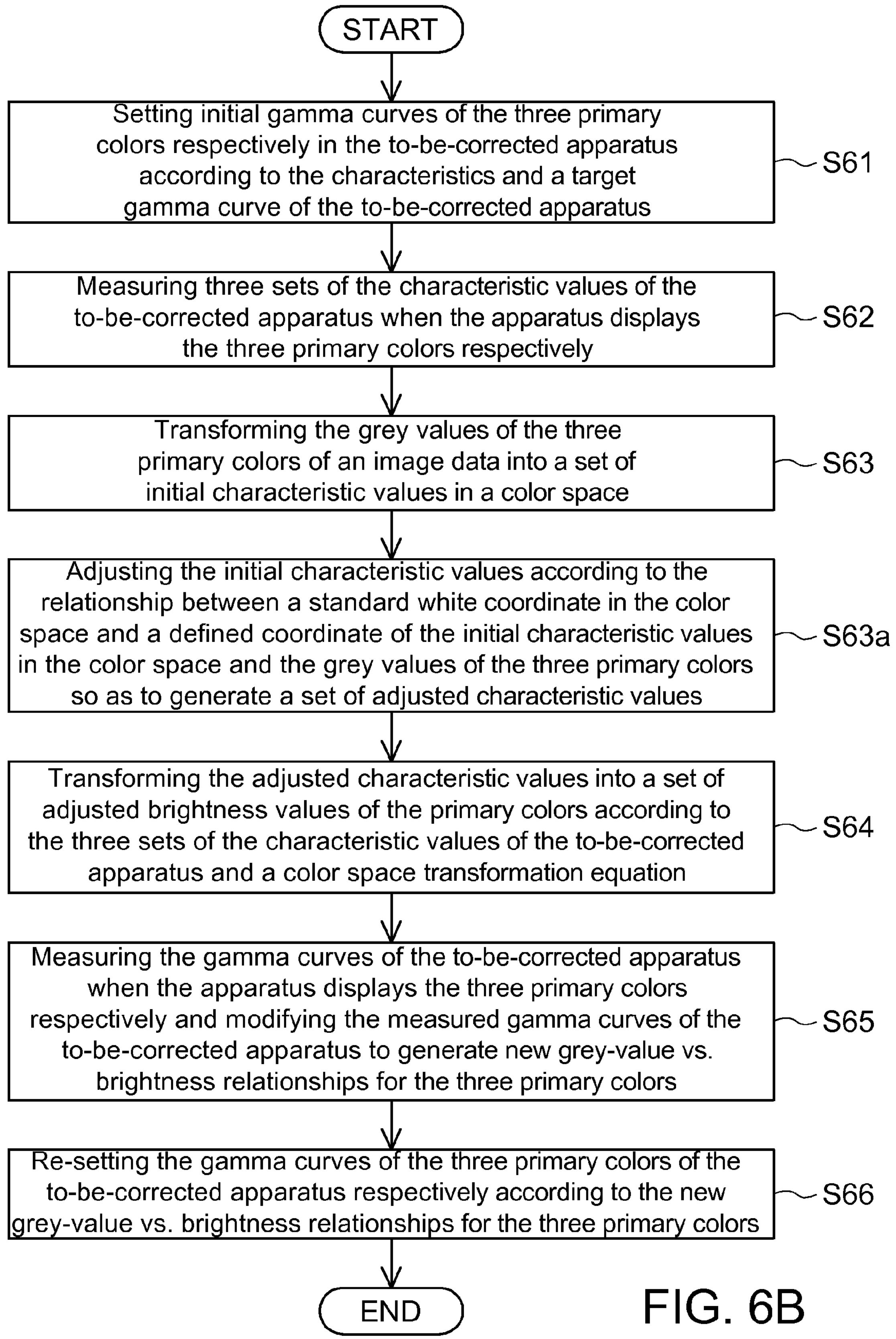
FIG. 6B shows another flowchart of a color correction method according to the second embodiment of the invention.

As shown in FIG. 6B, an additional step s63*a* can be added after the step S63. In step S63*a*, the characteristic values (X, Y, Z) are adjusted according to the relationship between a standard white coordinate in the color space and a defined coordinate of the characteristic values (X, Y, Z) in the color space and the grey values (R, G, B) of the three primary colors so as to generate the adjusted characteristic values (X', Y', Z'). The step S63*a* is mainly used for adjusting color saturation of an image. Since the step S63*a* is the same as the step S11*a* of the first embodiment, it is not elaborated here again.

Although the image data for being transformed into CIE XYZ color space is defined according to sRGB standard in the embodiment, the invention is not limited thereto. Other images defined by Adobe standard or other color system apparatus can also be transformed into CIE XYZ color space and then adjusted following the steps stated above.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A color correction method, comprising the following steps:

(a) transforming grey values (R, G, B) of three primary colors of an image data into initial characteristic values (Cx, Cy, Cz) in a color space;

(b) measuring three sets of characteristic values, namely (Cxr, Cyr, Czr), (Cxg, Cyg, Czg) and (Cxb, Cyb, Czb), of a to-be-corrected apparatus when the to-be-corrected apparatus displays the three primary colors respectively;

(c) transforming an adjusted characteristic values (Cx, Cy, Cz) into adjusted brightness values (dR', dG', dB') of the primary colors according to the three sets of characteristic values (Cxr, Cyr, Czr), (Cxg, Cyg, Czg) and (Cxb, Cyb, Czb) of the to-be-corrected apparatus and a color space transformation equation; and (d) measuring gamma curves of the to-be-corrected apparatus when the apparatus displays the respectively and modifying the measured gamma curves of the to-be corrected apparatus to generate new grey-value vs. brightness relationships for the three primary colors, so as to obtain adjusted grey values (R', G', B') of the primary colors corresponding to the adjusted brightness values (dR', dG', dB').

2. The color correction method according to claim 1, wherein the step (a) comprises:

(a1) transforming the grey values (R, G, B) of the three primary colors into original brightness values (dR, dG, dB) of the three primary colors; and (a2) transforming the original brightness values (dR, dG, dB) of the three primary colors into the initial characteristic values (Cx, Cy, Cz).

3. The color correction method according to claim 2, wherein the image data is defined according to sRGB standard, Adobe standard or other three color system.

4. The color correction method according to claim 1, wherein after the step (a), the method further comprises the step:

(e) adjusting the initial characteristic values (Cx, Cy, Cz) according to the relationship between a standard white coordinate and a defined coordinate of the initial characteristic values (Cx, Cy, Cz) in the color space and the grey values (R, G, B) of the three primary colors;

wherein the step (e) comprisies the steps of:

(e1) determining a color enhancement direction according to the standard white coordinate and the defined coordinate of the initial characteristic values (Cx, Cy, Cz) in the color space;

(e2) determining a color enhancement coefficient according to the difference between the maximum value and the minimum value of the grey values (R, G, B) of the three primary colors; and (e3) adjusting the initial characteristic values (Cx, Cy, Cz) as the adjusted characteristic values (Cx', Cy', Cz') according to the standard white coordinate, the defined coordinate of the initial characteristic values (Cx, Cy, Cz) in the color space, the color enhancement direction and the color enhancement coefficient.

5. The color correction method according to claim 4, wherein the image data is defined according to sRGB standard, the color space is a CIE XYZ color space, the initial characteristic values (Cx, Cy, Cz) is (X, Y, Z), and in the step (e1), the standard white coordinate is (xs, ys), the defined coordinate of the characteristic values (X, Y, Z) in the color space is (xin, yin), the color enhanced coordinate is (x', y'), and the coordinate (xin, yin) is obtained according to the equations stated below:

$$xin = \frac{X}{X+Y+Z},\ yin = \frac{Y}{X+Y+Z};$$

if xin≧xs, then x'≧xs, otherwise x'<xs; and if yin≧ys, then y'≧ys, otherwise y'<ys.

6. The color correction method according to claim 5, wherein in step (e3), a linear equation passing through the coordinate (xs, ys) and the coordinate (xin, yin) is expressed below according to the color enhancement coefficient k:

$$\frac{y'-ys}{x'-xs}=\frac{yin-ys}{xin-xs},$$

let the distance between (xs, ys) and (x', y') be k times the distance between (xs, ys) and (xin, yin):

$$\sqrt{(x'-xs)^2+(y'-ys)^2}=k\times\sqrt{(xin-xs)^2+(yin-ys)^2},$$

such that the color enhanced coordinate (x', y') is obtained, and each item of the adjusted characteristic values (Cx', Cy', Cz') is expressed as:

$$Cx'=x'\times(Y/y'),$$

$$Cy'=Y,$$

$$Cz'=(1-x'-y')\times(Y/y').$$

7. The color correction method according to claim 4, wherein in the step (e2), as the difference between the maximum value and the minimum value of the grey values (R, G, B) of the three primary colors becomes smaller, the color enhancement coefficient becomes larger.

8. The color correction method according to claim 7, wherein the difference between the maximum value and the minimum value of the grey values (R, G, B) of the three primary colors is classified to one of a plurality of different levels, and the color enhancement coefficient corresponding to different levels is different as well.

9. The color correction method according to claim 1, wherein in the step (d), the measured gamma curves of the three primary colors are modified according to a Boltzmann function so as to generate the new grey-value vs. brightness relationships for the three primary colors.

10. The color correction method according to claim 1, wherein in the step (d), the measured gamma curves of the three primary colors are modified according to the following functions, so as to generate the new grey-value vs. brightness relationships for the three primary colors:

$$dR'=\left(\frac{R'}{\text{max\_gray}}\right)^{gamma},$$

$$dG'=\left(\frac{G'}{\text{max\_gray}}\right)^{gamma},$$

$$dB'=\left(\frac{B'}{\text{max\_gray}}\right)^{gamma},$$

wherein max_grey is a maximum grey value that the to-be-corrected apparatus displays, and gamma value ranges from 1.8 to 2.4.

11. The color correction method according to claim 1, before the step (b), the method further comprises the following steps:

(f) setting initial gamma curves of the three primary colors respectively in the to-be-corrected apparatus according to the characteristics of the to-be-corrected apparatus and a target gamma value.

12. The color correction method according to claim 11, after the step (d), the method further comprises:

(g) re-setting the gamma curves of the three primary colors respectively in the to-be-corrected apparatus according to the new grey-value vs. brightness relationships for the three primary colors.

13. A color correcting integrated chip, comprising:

a storage unit used for storing a plurality of items of transformation characteristic data of different image formats;

a register used for temporarily storing three sets of characteristic values, namely (Cxr, Cyr, Czr), (Cxg, Cyg, Czg) and (Cxb, Cyb, Czb), of a to-be-corrected apparatus measured when the apparatus displays the three primary colors respectively and for temporarily storing gamma curves of the to-be-corrected apparatus measured when the apparatus displays the three primary colors respectively; and a color correction unit used for receiving an image data and accessing the transformation characteristic data of the image data from the storage unit according to the image format of the image data so as to transform grey values (R, G, B) of the three primary colors of the image data into initial characteristic values (Cx, Cy, Cz) in a color space, wherein the color correction unit further transforms the initial characteristic values (Cx, Cy, Cz) into a set of adjusted brightness values (dR', dG', dB') of the primary colors according to the three sets of the characteristic values (Cxr, Cyr, Czr), (Cxg, Cyg, Czg) and (Cxb, Cyb, Czb) and a color space transformation equation, the color correction unit further modifies the measured gamma curves of the three primary colors of the to-be-corrected apparatus to generate new grey-value vs. brightness relationships for the three primary colors, so as to obtain adjusted grey values (R', G', B') of the primary colors corresponding to the adjusted brightness values (dR', dG', dB') of the primary colors.

14. The integrated chip according to claim 13, wherein the color correction unit is used for transforming the grey values (R, G, B) of the three primary colors into original brightness values (dR, dG, dB) of the three primary colors, and for transforming the original brightness values (dR, dG, dB) of the three primary colors into the initial characteristic values (Cx, Cy, Cz).

15. The integrated chip according to claim 14, wherein the image data is defined according to sRGB standard, Adobe standard or other three color system.

16. The integrated chip according to claim 13, wherein the color correction unit determines a color enhancement direction according to the standard white coordinate and the defined coordinate of the initial characteristic values (Cx, Cy, Cz) in the color space;

the color correction unit further determines a color enhancement coefficient according to the difference between the maximum value and the minimum value of the grey values (R, G, B) of the three primary colors;

the color correction unit further adjusts the initial characteristic values (Cx, Cy, Cz) according to the standard white coordinate, the defined coordinate of the initial characteristic values (Cx, Cy, Cz) in the color space, the color enhancement direction and the color enhancement coefficient.

17. The integrated chip according to claim 16, wherein as the difference between the maximum value and the minimum value of the grey values (R, G, B) of the three primary colors becomes smaller, the color enhancement coefficient becomes larger.

18. The integrated chip according to claim 17, wherein the difference between the maximum value and the minimum value of the grey values (R, G, B) of the three primary colors is classified to one of a plurality of different levels, and the color enhancement coefficient corresponding to different levels is different as well.

19. The integrated chip according to claim 13, wherein the color correction unit modifies the measured gamma curves of the three primary colors according to a Boltzmann function so as to generate the new grey-value vs. brightness relationships for the three primary colors.

20. The integrated chip according to claim 13, wherein the measured gamma curves of the three primary colors are modified according to the following functions, so as to generate the new grey-value vs. brightness relationships for the three primary colors:

$$dR' = \left(\frac{R'}{\text{max\_gray}}\right)^{gamma},$$

$$dG' = \left(\frac{G'}{\text{max\_gray}}\right)^{gamma},$$

-continued $$dB' = \left(\frac{B'}{\text{max\_gray}}\right)^{gamma},$$

wherein max_grey is a maximum grey value that the to-be-corrected apparatus displays, and gamma value ranges from 1.8 to 2.4.

21. The integrated chip according to claim 13, wherein the color correction unit further re-sets the gamma curves of the three primary colors in the to-be-corrected apparatus respectively according to the new grey-value vs. brightness relationships for the three primary colors.

* * * * *